(12) United States Patent
Lin et al.

(10) Patent No.: US 12,100,687 B2
(45) Date of Patent: *Sep. 24, 2024

(54) INTEGRATED CIRCUIT PRODUCT AND CHIP FLOORPLAN ARRANGEMENT THEREOF

(71) Applicant: Alchip Technologies, Ltd., Grand Cayman (KY)

(72) Inventors: Wen-Hsi Lin, Taipei (TW); Kai-Ting Ho, Taipei (TW)

(73) Assignee: Alchip Technologies, Ltd., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 18/371,805

(22) Filed: Sep. 22, 2023

(65) Prior Publication Data

US 2024/0014173 A1 Jan. 11, 2024

Related U.S. Application Data

(62) Division of application No. 17/572,250, filed on Jan. 10, 2022, now Pat. No. 11,830,850.

(Continued)

(30) Foreign Application Priority Data

Aug. 23, 2021 (CN) .......................... 202110967790.0

(51) Int. Cl.
*H01L 25/065* (2023.01)
*H01L 25/18* (2023.01)

(52) U.S. Cl.
CPC .......... *H01L 25/0655* (2013.01); *H01L 25/18* (2013.01)

(58) Field of Classification Search
CPC ..... H01L 25/0655; H01L 25/18; H01L 24/08; H01L 24/16; H01L 2224/08137; H01L 25/16; H01L 2924/1431; H01L 2924/1434
See application file for complete search history.

(56) References Cited

U.S. PATENT DOCUMENTS 7,608,919 B1 10/2009 Bernstein et al.
11,830,850 B2 * 11/2023 Lin ..................... H01L 25/0655

(Continued)

FOREIGN PATENT DOCUMENTS

TW 200723356 A 6/2007

OTHER PUBLICATIONS

U.S. Office Action for U.S. Appl. No. 17/572,382, dated Dec. 19, 2023.

(Continued)

*Primary Examiner* — Thanh Y. Tran
(74) *Attorney, Agent, or Firm* — Birch, Stewart, Kolasch & Birch, LLP

(57) ABSTRACT

An integrated circuit product includes a first chip to a twelfth chip. The first to fourth chips are respectively arranged in a first quadrant, a fourth quadrant, a third quadrant, and a second quadrant of the integrated circuit product, and the first chip is adjacent to the second chip and the fourth chip. The fifth to eighth chips are respectively arranged in the first quadrant, the fourth quadrant, the third quadrant, and the second quadrant of the integrated circuit product, and any two of the fifth to eighth chips are not adjacent to each other. The ninth to twelfth chips are respectively arranged in the first quadrant, the fourth quadrant, the third quadrant, and the second quadrant of the integrated circuit product, and any two of the ninth to twelfth chips are not adjacent to each other.

27 Claims, 15 Drawing Sheets

Related U.S. Application Data

(60) Provisional application No. 63/166,703, filed on Mar. 26, 2021.

(56) References Cited

U.S. PATENT DOCUMENTS

| | | |
|---|---|---|
| 2007/0027567 A1 | 2/2007 | Lin et al. |
| 2017/0127518 A1 | 5/2017 | Kulick et al. |
| 2017/0162532 A1 | 6/2017 | Kulick et al. |

OTHER PUBLICATIONS

Taiwanese Office Action and Search Report for Taiwanese Application No. 110131167, dated Mar. 4, 2022, with English translation.
Taiwanese Office Action and Search Report for Taiwanese Application No. 111123117, dated Nov. 8, 2022, with English translation.

\* cited by examiner

INTEGRATED CIRCUIT PRODUCT AND CHIP FLOORPLAN ARRANGEMENT THEREOF

CROSS-REFERENCE TO RELATED APPLICATIONS

This application is a Divisional of co-pending U.S. patent application Ser. No. 17/572,250, filed on Jan. 10, 2022, which claims the benefit of priority to Patent Application No. 202110967790.0, filed in China on Aug. 23, 2021, and also claims the benefit of priority to U.S. Provisional Application Ser. No. 63/166,703, filed on Mar. 26, 2021; the entirety of which is incorporated herein by reference for all purposes.

BACKGROUND

The present invention generally relates to the packaging of integrated circuits (ICs), and, more particularly, to the floorplan arrangement of the chips and/or chiplets (hereinafter collectively referred to as chips) of IC packaging.

Nowadays advanced packaging is common in the IC industry. However, the poor floorplan arrangement may result in the following drawbacks: wasted area (which renders the finished product uncompetitive due to the large size), poor heat dissipation (which degrades the chip performance), difficulty in output and/or input wiring (which increases the difficulty of packaging), and/or non-ideal relative positions of the chips (which causes waste of chip pins). Therefore, a floorplan arrangement of the chips is needed to solve at least one of the above-mentioned problems.

SUMMARY

An example embodiment of an integrated circuit (IC) product is disclosed, comprising: a first chip, a second chip, a third chip, a fourth chip, a fifth chip, a sixth chip, a seventh chip, an eighth chip, a ninth chip, a tenth chip, an eleventh chip, and a twelfth chip. The first chip, the second chip, the third chip, and the fourth chip are respectively arranged in a first quadrant, a fourth quadrant, a third quadrant, and a second quadrant of the IC product, and the first chip is adjacent to the second chip and the fourth chip. The fifth chip, the sixth chip, the seventh chip, and the eighth chip are respectively arranged in the first quadrant, the fourth quadrant, the third quadrant, and the second quadrant of the IC product, and any two of the fifth chip, the sixth chip, the seventh chip, and the eighth chip are not adjacent to each other. The ninth chip, the tenth chip, the eleventh chip, and the twelfth chip are respectively arranged in the first quadrant, the fourth quadrant, the third quadrant, and the second quadrant of the IC product, and any two of the ninth chip, the tenth chip, the eleventh chip, and the twelfth chip are not adjacent to each other.

Another example embodiment of an integrated circuit (IC) product is disclosed, comprising: a first chip, a second chip, a third chip, a fourth chip, a fifth chip, a sixth chip, a seventh chip, an eighth chip, a ninth chip, a tenth chip, an eleventh chip, and a twelfth chip. The first chip, the second chip, the third chip, the fourth chip, the fifth chip, the sixth chip, the seventh chip, the eighth chip, the ninth chip, the tenth chip, the eleventh chip, and the twelfth chip are substantially on a plane. If the first chip is rotated 90 degrees on the plane with respect to a center of the IC product, the first chip will substantially overlap with the second chip or the fourth chip, and if the first chip is rotated 180 degrees on the plane with respect to the center, the first chip will substantially overlap with the third chip. If the fifth chip is rotated 90 degrees on the plane with respect to the center, the fifth chip will substantially overlap with the sixth chip or the eighth chip, and if the fifth chip is rotated 180 degrees on the plane with respect to the center, the fifth chip will substantially overlap with the seventh chip. If the ninth chip is rotated 90 degrees on the plane with respect to the center, the ninth chip will substantially overlap with the tenth chip or the twelfth chip, and if the ninth chip is rotated 180 degrees on the plane with respect to the center, the ninth chip will substantially overlap with the eleventh chip.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings.

The same reference numbers may be used throughout the drawings to refer to the same or like parts, components, or operations.

Figure 1:
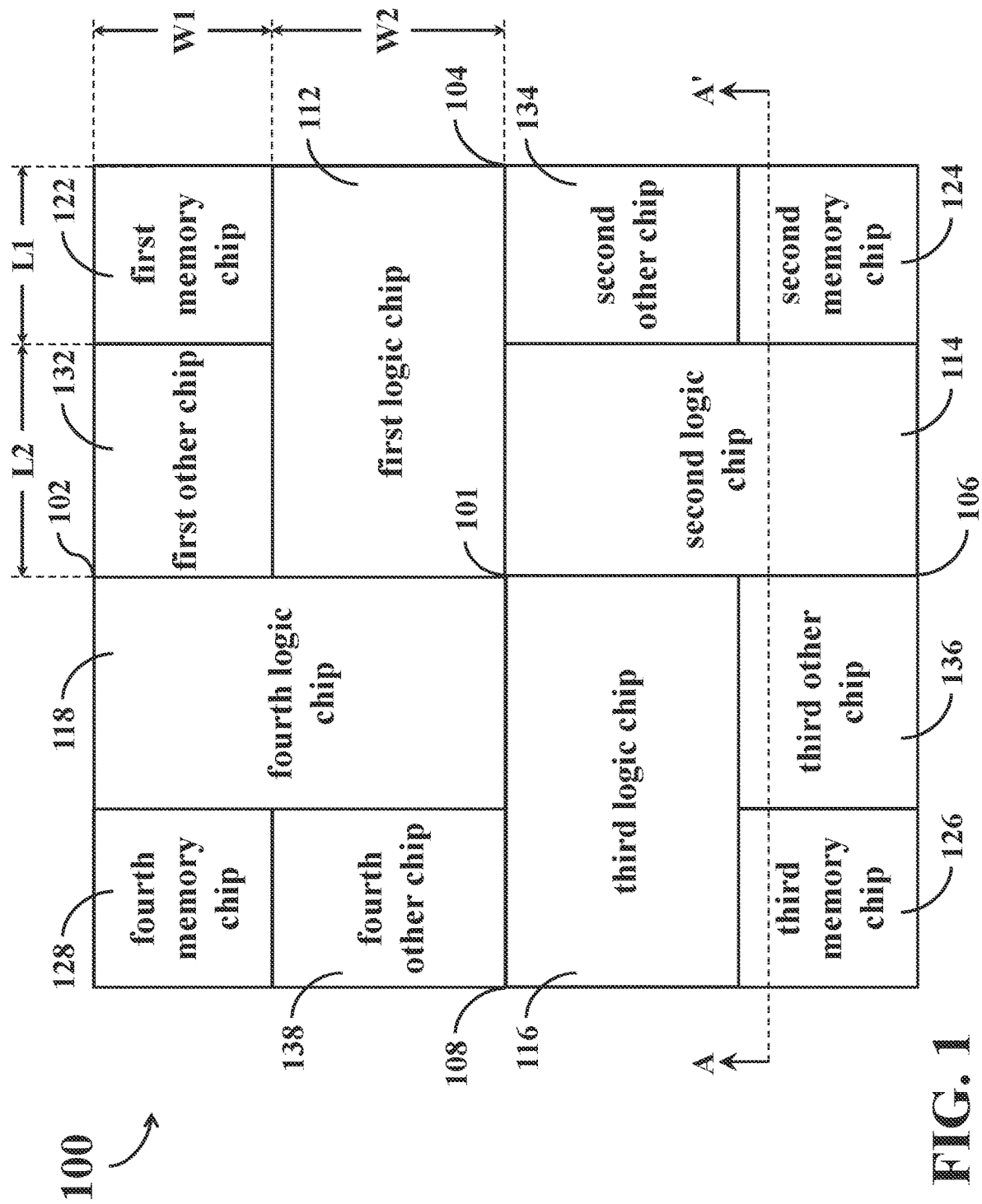
FIG. 1 illustrates a schematic diagram of a simplified chip floorplan arrangement of an IC product according to an embodiment of the present invention.
Figure 2:
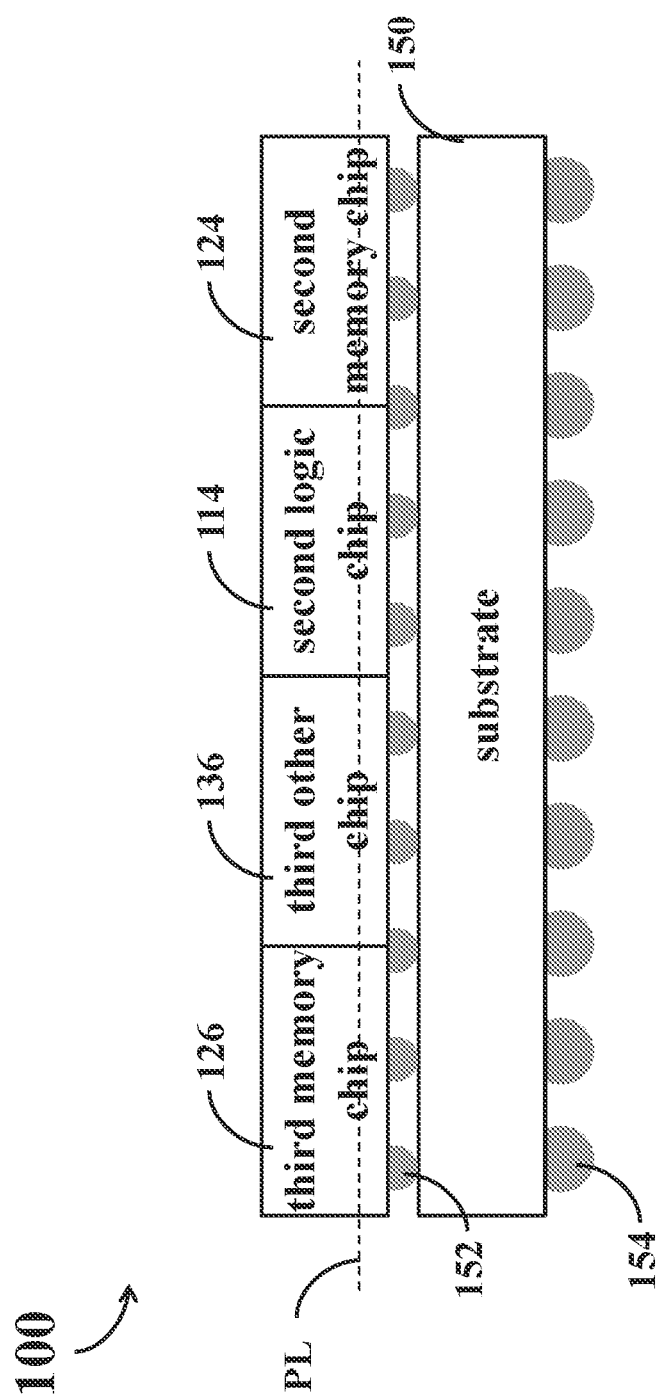
FIG. 2 illustrates a simplified side view of an IC product according to an embodiment of the present invention.
Figure 3:
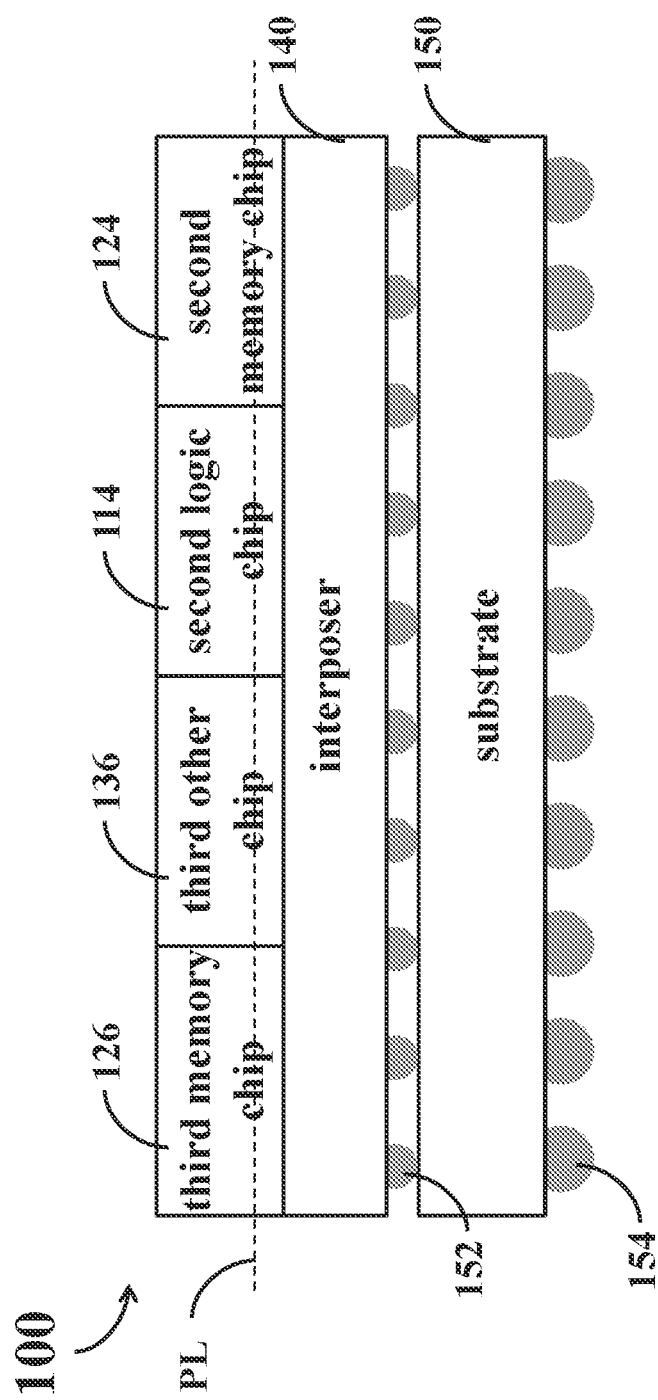
FIG. 3 illustrates a simplified side view of an IC product according to another embodiment of the present invention.

FIG. 1 is a schematic diagram of a simplified chip floorplan arrangement of an IC product according to an embodiment of the present invention. The IC product 100 includes a first logic chip 112, a second logic chip 114, a third logic chip 116, a fourth logic chip 118, a first memory chip 122, a second memory chip 124, a third memory chip 126, a fourth memory chip 128, a first other chip 132, a second other chip 134, a third other chip 136, and a fourth other chip 138. FIG. 1 shows a top view of an IC product 100, and FIGS. 2 and 3 each show a simplified side view of an IC product (along the A-A' cross-section in FIG. 1) according to an embodiment of the present invention. In the embodiment of FIG. 2, the IC product 100 includes a substrate 150, and the logic chips, the memory chips, and the other chips shown in FIG. 1 are arranged at the same plane PL on the substrate 150. There are multiple micro bumps 152 between the substrate 150 and the logic chips, memory chips, and other chips, and there are multiple bumps 154 under the substrate 150. In the embodiment of FIG. 3, the IC product 100 includes an interposer 140, and the logic chips, the memory chips, and the other chips shown in FIG. 1 are arranged on the interposer 140. There are multiple micro bumps 152 between the interposer 140 and the substrate 150, and there are multiple bumps 154 under the substrate 150. The first logic chip 112, the second logic chip 114, the third logic chip 116, and the fourth logic chip 118 may be logic circuits with computing capabilities, such as System on a Chip (SoC). The logic chips can carry out specific functions by accessing the memory chips. For example, the logic chips carry out the functions by reading and executing the program codes or program instructions stored in the memory chips.

Reference is made back to FIG. 1. The IC product 100 has a first side 102, a second side 104, a third side 106, and a fourth side 108. The four sides of the IC product 100 may be the four sides of the substrate 150. The IC product 100 further has a center 101. One side of the first logic chip 112 and the second side 104 substantially overlap (i.e., one side of the first logic chip 112 is substantially aligned with the second side 104), that is, the first logic chip 112 is adjacent to the second side 104. Similarly, one side of the second logic chip 114 and the third side 106 substantially overlap, one side of the third logic chip 116 and the fourth side 108 substantially overlap, and one side of the fourth logic chip 118 and the first side 102 substantially overlap.

Similarly, one side of the first other chip 132, one side of the second other chip 134, one side of the third other chip 136, and one side of the fourth other chip 138 substantially overlap with the first side 102, the second side 104, the third side 106, and the fourth side 108, respectively.

Similarly, one side of the first memory chip 122, one side of the second memory chip 124, one side of the third memory chip 126, and one side of the fourth memory chip 128 substantially overlap with the first side 102, the second side 104, the third side 106, and the fourth side 108, respectively. In addition, because the first memory chip 122, the second memory chip 124, the third memory chip 126, and the fourth memory chip 128 are arranged at the four corners of the IC product 100, another side of the first memory chip 122, another side of the second memory chip 124, another side of the third memory chip 126, and another side of the fourth memory chip 128 substantially overlap with the second side 104, the third side 106, the fourth side 108, and the first side 102, respectively.

As shown in FIG. 1, the first logic chip 112 is adjacent to the second logic chip 114 and the fourth logic chip 118, the second logic chip 114 is adjacent to the first logic chip 112 and the third logic chip 116, the third logic chip 116 is adjacent to the second logic chip 114 and the fourth logic chip 118, and the fourth logic chip 118 is adjacent to the first logic chip 112 and the third logic chip 116. In some embodiments, the vertices of the first logic chip 112, the second logic chip 114, the third logic chip 116, and the fourth logic chip 118 substantially contact each other at the center 101. However, the first memory chip 122, the second memory chip 124, the third memory chip 126, and the fourth memory chip 128 are not adjacent to each other, and the first other chip 132, the second other chip 134, the third other chip 136, and the fourth other chip 138 are not adjacent to each other.

In some embodiments, the areas of the first logic chip 112, the second logic chip 114, the third logic chip 116, and the fourth logic chip 118 are substantially identical; the areas of the first memory chip 122, the second memory chip 124, the third memory chip 126, and the fourth memory chip 128 are substantially identical; and the areas of the first other chip 132, the second other chip 134, the third other chip 136, and the fourth other chip 138 are substantially identical.

In some embodiments, the first logic chip 112, the second logic chip 114, the third logic chip 116, and the fourth logic chip 118 include substantially the same constituent components; the first memory chip 122, the second memory chip 124, the third memory chip 126, and the fourth memory chip 128 include substantially the same constituent components; and the first other chip 132, the second other chip 134, the third other chip 136, and the fourth other chip 138 include substantially the same constituent components. The constituent components include, but are not limited to, transistors, resistors, capacitors, and/or inductors. In other embodiments, the constituent components of the first logic chip 112, the second logic chip 114, the third logic chip 116, and the fourth logic chip 118 are the same in terms of both type(s) and quantity; the constituent components of the first memory chip 122, the second memory chip 124, the third memory chip 126, and the fourth memory chip 128 are the same in terms of both type(s) and quantity; and the constituent components of the first other chip 132, the second other chip 134, the third other chip 136, and the fourth other chip 138 are the same in terms of both type(s) and quantity.

In some embodiments, the first other chip 132, the second other chip 134, the third other chip 136, and the fourth other chip 138 are input/output (I/O) chips that contain I/O circuits, and the first logic chip 112, the second logic chip 114, the third logic chip 116, and the fourth logic chip 118 use the I/O circuits to transmit or receive signals. In other embodiments, the first other chip 132, the second other chip 134, the third other chip 136, and the fourth other chip 138 are silicon chips that do not contain any circuits.

Figure 4:
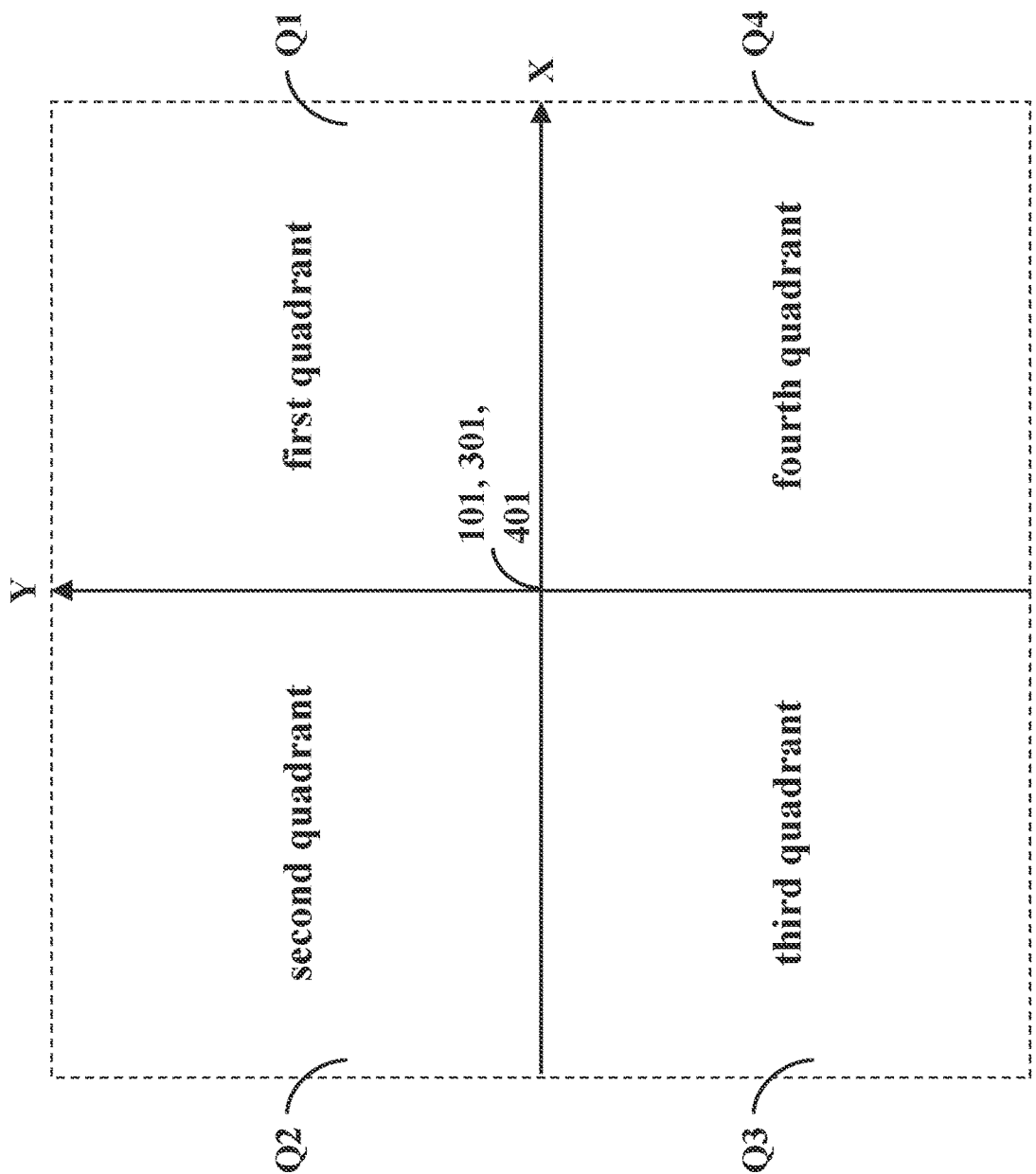
FIG. 4 illustrates the center point and the distribution of the quadrants of the IC product according to the present invention.

Reference is made to FIG. 1 and FIG. 4. The IC product 100 is divided into four quadrants by the X-axis and Y-axis that are perpendicular to each other, and the X-axis and Y-axis intersect at the center 101. The first chip group (including the first logic chip 112, the first memory chip 122, and the first other chip 132) is arranged in the first quadrant Q1; the second chip group (including the second logic chip 114, the second memory chip 124, and the second other chip 134) is arranged in the fourth quadrant Q4; the third chip group (including the third logic chip 116, the third memory chip 126, and the third other chip 136) is arranged in the third quadrant Q3; and the fourth chip group (including the fourth logic chip 118, the fourth memory chip 128, and the fourth other chip 138) is arranged in the second quadrant Q2. The relative position between the first logic chip 112 and the first memory chip 122 is identical to the relative position between the second logic chip 114 (the third logic chip 116 or the fourth logic chip 118) and the second memory chip 124 (the third memory chip 126 or the fourth memory chip 128); the relative position between the first logic chip 112 and the first other chip 132 is identical to the relative position between the second logic chip 114 (the third logic chip 116 or the fourth logic chip 118) and the second other chip 134 (the third other chip 136 or the fourth other chip 138); the relative position between the first memory chip 122 and the first other chip 132 is identical to the relative position between the second memory chip 124 (the third memory chip 126 or the fourth memory chip 128) and the second other chip 134 (the third other chip 136 or the fourth other chip 138).

If the first chip group is rotated 90 degrees clockwise on the plane PL with respect to the center 101, the first chip group and the second chip group will substantially overlap (i.e., the first logic chip 112 and the second logic chip 114 together possess rotational symmetry, the first memory chip 122 and the second memory chip 124 together possess rotational symmetry, and the first other chip 132 and the second other chip 134 together possess rotational symmetry, with the center of rotational symmetry being the center 101 and the rotation angle being 90 degrees). Similarly, if the first chip group is rotated 90 degrees counterclockwise or 270 degrees clockwise on the plane PL with respect to the center 101, the first chip group and the fourth chip group will substantially overlap.

If the first chip group is rotated 180 degrees on the plane PL with respect to the center 101, the first chip group and the third chip group will substantially overlap. In other words, the first chip group and the third chip group together possess point symmetry with respect to the center 101 (i.e., the first logic chip 112 and the third logic chip 116 together possess point symmetry; the first memory chip 122 and the third memory chip 126 together possess point symmetry; and the first other chip 132 and the third other chip 136 together possess point symmetry, with the center 101 being the center of symmetry). Similarly, the second chip group and the fourth chip group together possess point symmetry with respect to the center 101.

In other words, in some embodiments, the first chip group, the second chip group, the third chip group, and the fourth chip group are each a constituent unit of the IC product 100, that is, the first logic chip 112, the second logic chip 114, the third logic chip 116, and the fourth logic chip 118 can access or be coupled to the first memory chip 122, the second memory chip 124, the third memory chip 126, and the fourth memory chip 128, respectively, and the first logic chip 112, the second logic chip 114, the third logic chip 116, and the fourth logic chip 118 may be coupled to the first other chip 132, the second other chip 134, the third other chip 136, and the fourth other chip 138, respectively. One of the advantages of such an arrangement is that the outward pins (i.e., the pins to the outside of the IC product 100) of the first logic chip 112 (the second logic chip 114, the third logic chip 116, or the fourth logic chip 118) can be arranged on the second side 104 (the third side 106, the fourth side 108, or the first side 102), while the inward pins (e.g., the pins communicating with the first memory chip 122, the second memory chip 124, the third memory chip 126, the fourth memory chip 128, the first other chip 132, the second other chip 134, the third other chip 136, or the fourth other chip 138) can be arranged on the side that borders the memory chip or the other chip. In this way, because the chip floorplan arrangement of the IC product 100 is simple (by merely rotating the first chip group by 90 degrees, 180 degrees, and 270 degrees), different areas of the IC product 100 can be manufactured using the same photomask, which greatly simplifies the manufacturing process without wasted pins.

In some embodiments, the heat-generating parts of the first logic chip 112, the second logic chip 114, the third logic chip 116, and the fourth logic chip 118 can be arranged close to the sides of the IC product 100 to improve the heat dissipation performance of the IC product 100. In addition, because the first logic chip 112, the second logic chip 114, the third logic chip 116, and the fourth logic chip 118 are adjacent to each other, it is easier to connect the first logic chip 112, the second logic chip 114, the third logic chip 116, and the fourth logic chip 118 (e.g., through the interposer 140 and/or the substrate 150), making communications (e.g., data exchange) and collaborative processing between the first logic chip 112, the second logic chip 114, the third logic chip 116, and the fourth logic chip 118 easier and more feasible.

In other embodiments, the first chip group, the second chip group, the third chip group, and the fourth chip group are square. More specifically, taking the first chip group in FIG. 1 as an example, W1+W2=L1+L2, where W1 is the width of the first memory chip 122 and the first other chip 132, W2 is the width of the first logic chip 112, L1 is the length of the first memory chip 122, L2 is the length of the first other chip 132, and the length of the first logic chip 112 is L1+L2. Furthermore, because the first chip group, the second chip group, the third chip group, and the fourth chip group are all square, the IC product 100 is also square.

Figure 5:
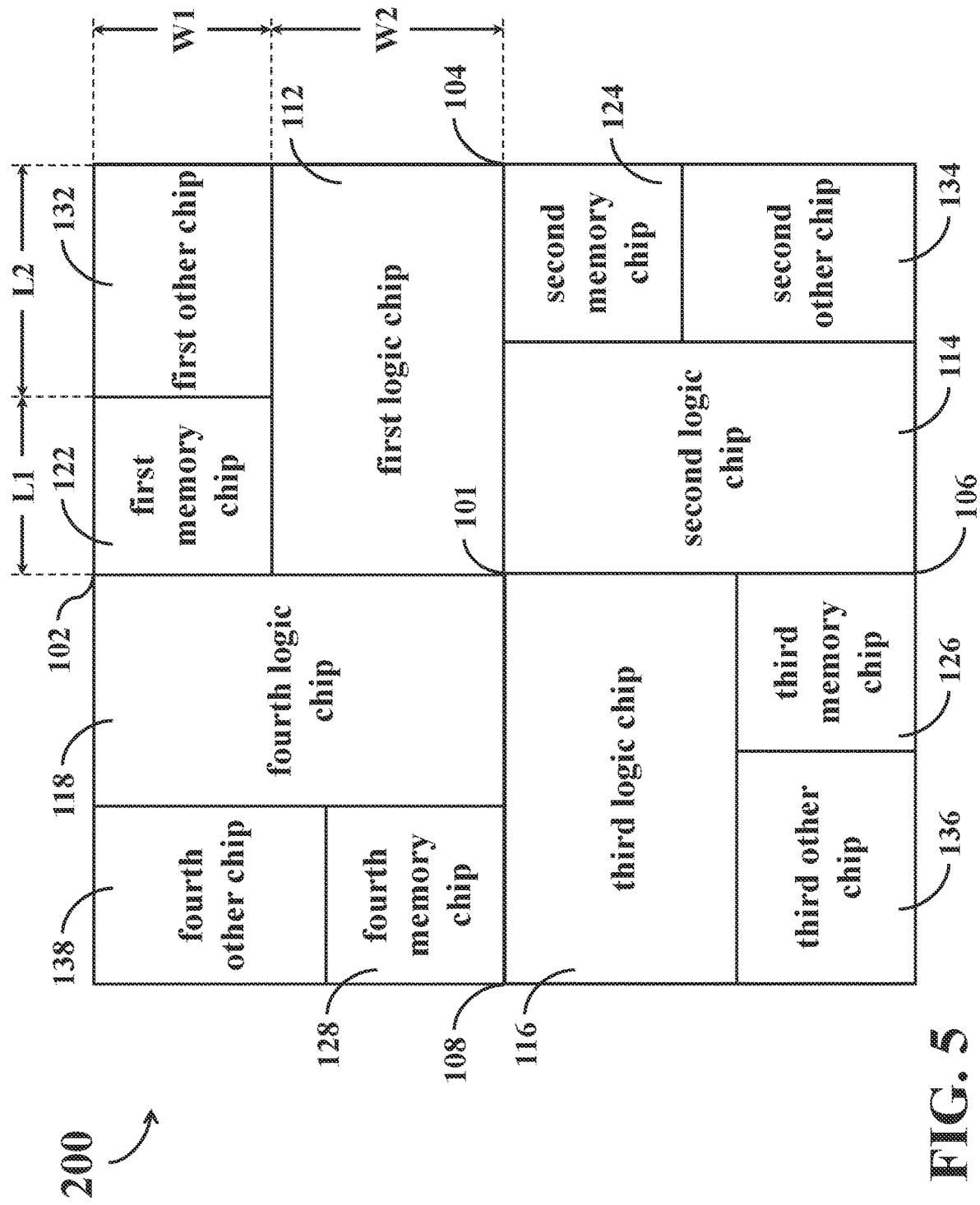
FIG. 5 illustrates a schematic diagram of a simplified chip floorplan arrangement of an IC product according to another embodiment of the present invention.

FIG. 5 is a schematic diagram of a simplified chip floorplan arrangement of an IC product according to another embodiment of the present invention. FIG. 5 shows a top view of the IC product 200. The IC product 200 is similar to the IC product 100, except that the first memory chip 122 and the first other chip 132 are interchanged, the second memory chip 124 and the second other chip 134 are interchanged, the third memory chip 126 and the third other chip 136 are interchanged, and the fourth memory chip 128 and the fourth other chip 138 are interchanged. As a result, in the embodiment of FIG. 5, the first other chip 132, the second other chip 134, the third other chip 136, and the fourth other chip 138 are arranged at the four corners of the IC product 200; therefore, one side of the first other chip 132, one side of the second other chip 134, one side of the third other chip 136, and one side of the fourth other chip 138 substantially overlap with the first side 102, the second side 104, the third side 106, and the fourth side 108, respectively, while another side of the first other chip 132, another side of the second other chip 134, another side of the third other chip 136, and another side of the fourth other chip 138 substantially overlap the second side 104, the third side 106, the fourth side 108, and the first side 102, respectively.

Figure 6:
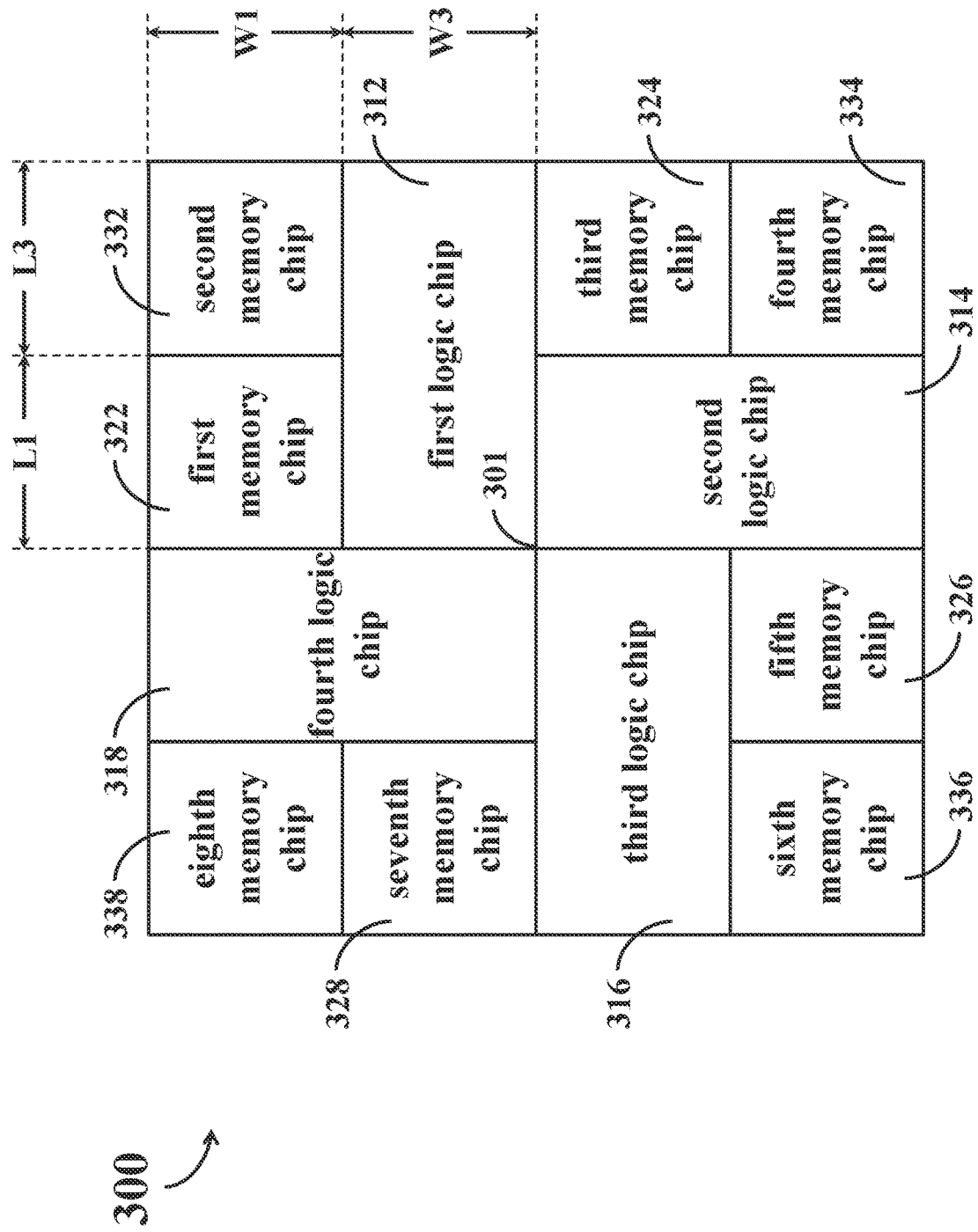
FIG. 6 illustrates a schematic diagram of a simplified chip floorplan arrangement of an IC product according to another embodiment of the present invention.

FIG. 6 is a schematic diagram of a simplified chip floorplan arrangement of an IC product according to another embodiment of the present invention. FIG. 6 shows a top view of the IC product 300. The IC product 300 includes a first logic chip 312, a second logic chip 314, a third logic chip 316, a fourth logic chip 318, a first memory chip 322, a second memory chip 332, and a third memory chip 324, a fourth memory chip 334, a fifth memory chip 326, a sixth memory chip 336, a seventh memory chip 328, and an eighth memory chip 338. The chip floorplan arrangement and characteristics of the IC product 300 are similar to those of the IC product 100 and the IC product 200, except that each chip group of the IC product 300 includes one logic chip and two memory chips but does not include any other chip.

In some embodiments, each of the first chip group (including the first logic chip 312, the first memory chip 322, and the second memory chip 332), the second chip group (including the second logic chip 314, the third memory chip 324, and the fourth memory chip 334), the third chip group (including the third logic chip 316, the fifth memory chip 326, and the sixth memory chip 336), and the fourth chip group (including the fourth logic chip 318, the seventh memory chip 328, and the eighth memory chip 338) is a square. Taking the first chip group as an example, W1+W3=L1+L3, where W1 is the width of the first memory chip 322 and the second memory chip 332, W3 is the width of the first logic chip 312, L1 is the length of the first memory chip 322, L3 is the length of the second memory chip 332, and the length of the first logic chip 312 is L1+L3. If the first chip group is rotated 90 degrees, 180 degrees, and 270 degrees clockwise with respect to the center 301, the chips of the first chip group after the rotation will substantially overlap with the respectively corresponding chips of the second chip group, the third chip group, and the fourth chip group (in which case the first logic chip 312, the second logic chip 314, the third logic chip 316, and the fourth logic chip 318 correspond to each other; the first memory chip 322, the third memory chip 324, the fifth memory chip 326, and the seventh memory chip 328 correspond to each other; and the second memory chip 332, the fourth memory chip 334, the sixth memory chip 336, and the eighth memory chip 338 correspond to each other). Furthermore, because the first chip group, the second chip group, the third chip group, and the fourth chip group are all square, the IC product 300 is also square.

For the first chip group, the first logic chip 312 can access the first memory chip 322 and the second memory chip 332. Similar may be said with respect to other chip groups, and the details shall be omitted herein.

In some embodiments, the first logic chip 312, the second logic chip 314, the third logic chip 316, and the fourth logic chip 318 include substantially the same constituent components; the first memory chip 322, the third memory chip 324, the fifth memory chip 326, and the seventh memory chip 328 include substantially the same constituent components; and the second memory chip 332, the fourth memory chip 334, the sixth memory chip 336, and the eighth memory chip 338 include substantially the same constituent components. The constituent components include, but are not limited to, transistors, resistors, capacitors, and/or inductors. In other embodiments, the constituent components of the first logic chip 312, the second logic chip 314, the third logic chip 316, and the fourth logic chip 318 are the same in terms of both type(s) and quantity; the constituent components of the first memory chip 322, the third memory chip 324, the fifth memory chip 326, and the seventh memory chip 328 are the same in terms of both type(s) and quantity; and the constituent components of the second memory chip 332, the fourth memory chip 334, the sixth memory chip 336, and the eighth memory chip 338 are the same in terms of both type(s) and quantity.

In some embodiments, the eight memory chips in FIG. 6 are totally the same; in other words, L1=L3.

In other embodiments, the eight memory chips in FIG. 6 are the high bandwidth memory generation 3 (HBM3), and W1=L1=L3.

Figure 7:
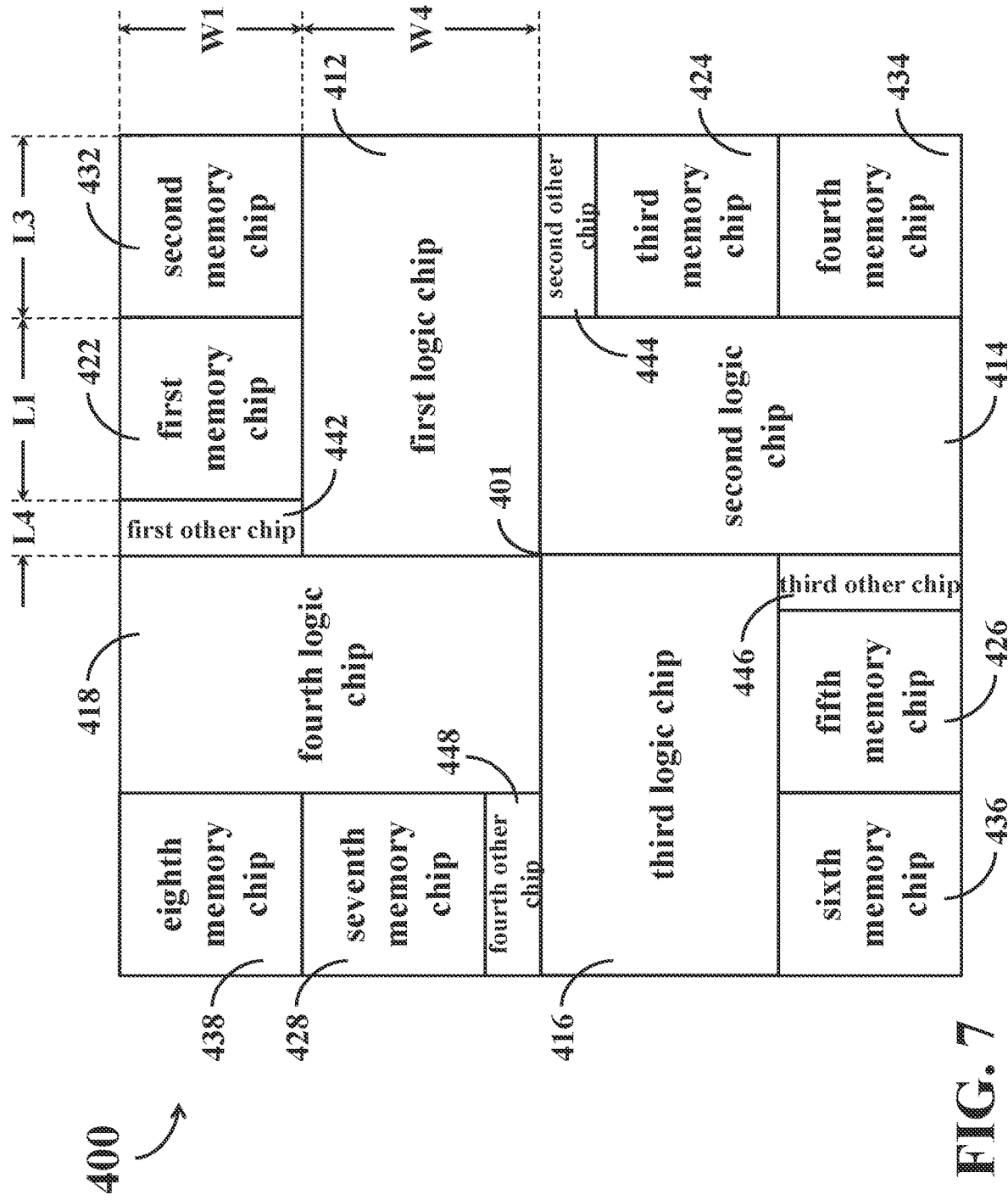
FIG. 7 illustrates a schematic diagram of a simplified chip floorplan arrangement of an IC product according to another embodiment of the present invention.

FIG. 7 is a schematic diagram of a simplified chip floorplan arrangement of an IC product according to another embodiment of the present invention. FIG. 7 shows a top view of the IC product 400. The IC product 400 includes a first logic chip 412, a second logic chip 414, a third logic chip 416, a fourth logic chip 418, a first memory chip 422, a second memory chip 432, and a third memory chip 424, a fourth memory chip 434, a fifth memory chip 426, a sixth memory chip 436, a seventh memory chip 428, an eighth memory chip 438, a first other chip 442, a second other chip 444, a third other chip 446, and a fourth other chip 448. The chip floorplan arrangement and characteristics of the IC product 400 are similar to those of the IC product 100 and the IC product 200, except that each chip group of the IC product 400 includes one logic chip, two memory chips, and one other chip.

In some embodiments, each of the first chip group (including the first logic chip 412, the first memory chip 422, the second memory chip 432, and the first other chip 442), the second chip group (including the second logic chip 414, the third memory chip 424, the fourth memory chip 434, and the second other chip 444), the third chip group (including the third logic chip 416, the fifth memory chip 426, the sixth memory chip 436, and the third other chip 446), and the fourth chip group (including the fourth logic chip 418, the seventh memory chip 428, the eighth memory chip 438, and the fourth other chip 448) is a square. Taking the first chip group as an example, W1+W4=L1+L3+L4, where W1 is the width of the first memory chip 422, the second memory chip 432, and the first other chip 442, W4 is the width of the first logic chip 412, L1 is the length of the first memory chip 422, L3 is the length of the second memory chip 432, L4 is the length of the first other chip 442, and the length of the first logic chip 412 is L1+L3+L4. If the first chip group is rotated 90 degrees, 180 degrees, and 270 degrees clockwise with respect to the center 401, the chips of the first chip group after the rotation will substantially overlap with the respectively corresponding chips of the second chip group, the third chip group, and the fourth chip group (in which case the first logic chip 412, the second logic chip 414, the third logic chip 416, and the fourth logic chip 418 correspond to each other; the first memory chip 422, the third memory chip 424, the fifth memory chip 426, and the seventh memory chip 428 correspond to each other; the second memory chip 432, the fourth memory chip 434, the sixth memory chip 436, and the eighth memory chip 438 correspond to each other; and the first other chip 442, the second other chip 444, the third other chip 446, and the fourth other chip 448 correspond to each other). Furthermore, because the first chip group, the second chip group, the third chip group, and the fourth chip group are all square, the IC product 400 is also square.

For the first chip group, the first logic chip 412 can access the first memory chip 422 and the second memory chip 432. Similar may be said with respect to other chip groups, and the details shall be omitted herein.

In some embodiments, the first logic chip 412, the second logic chip 414, the third logic chip 416, and the fourth logic chip 418 include substantially the same constituent components; the first memory chip 422, the third memory chip 424, the fifth memory chip 426, and the seventh memory chip 428 include substantially the same constituent components; the second memory chip 432, the fourth memory chip 434, the sixth memory chip 436, and the eighth memory chip 438 include substantially the same constituent components; and the first other chip 442, the second other chip 444, the third other chip 446, and the fourth other chip 448 include substantially the same constituent components. The constituent components include, but are not limited to, transistors, resistors, capacitors, and/or inductors. In other embodiments, the constituent components of the first logic chip 412, the second logic chip 414, the third logic chip 416, and the fourth logic chip 418 are the same in terms of both type(s) and quantity; the constituent components of the first memory chip 422, the third memory chip 424, the fifth memory chip 426, and the seventh memory chip 428 are the same in terms of both type(s) and quantity; the constituent components of the second memory chip 432, the fourth memory chip 434, the sixth memory chip 436, and the eighth memory chip 438 are the same in terms of both type(s) and quantity; and the constituent components of the first other chip 442, the second other chip 444, the third other chip 446, and the fourth other chip 448 are the same in terms of both type(s) and quantity.

In some embodiments, the eight memory chips in FIG. 7 are totally the same; in other words, L1=L3.

In the embodiment of FIG. 7, the second memory chip 432, the fourth memory chip 434, the sixth memory chip 436, and the eighth memory chip 438 are arranged at the four corners of the IC product 400; and the first memory chip 422 (the third memory chip 424, the fifth memory chip 426, or the seventh memory chip 428) is arranged between the second memory chip 432 (the fourth memory chip 434, the sixth memory chip 436, or the eighth memory chip 438) and the first other chip 442 (the second other chip 444, the third other chip 446, or the fourth other chip 448).

Figure 8:
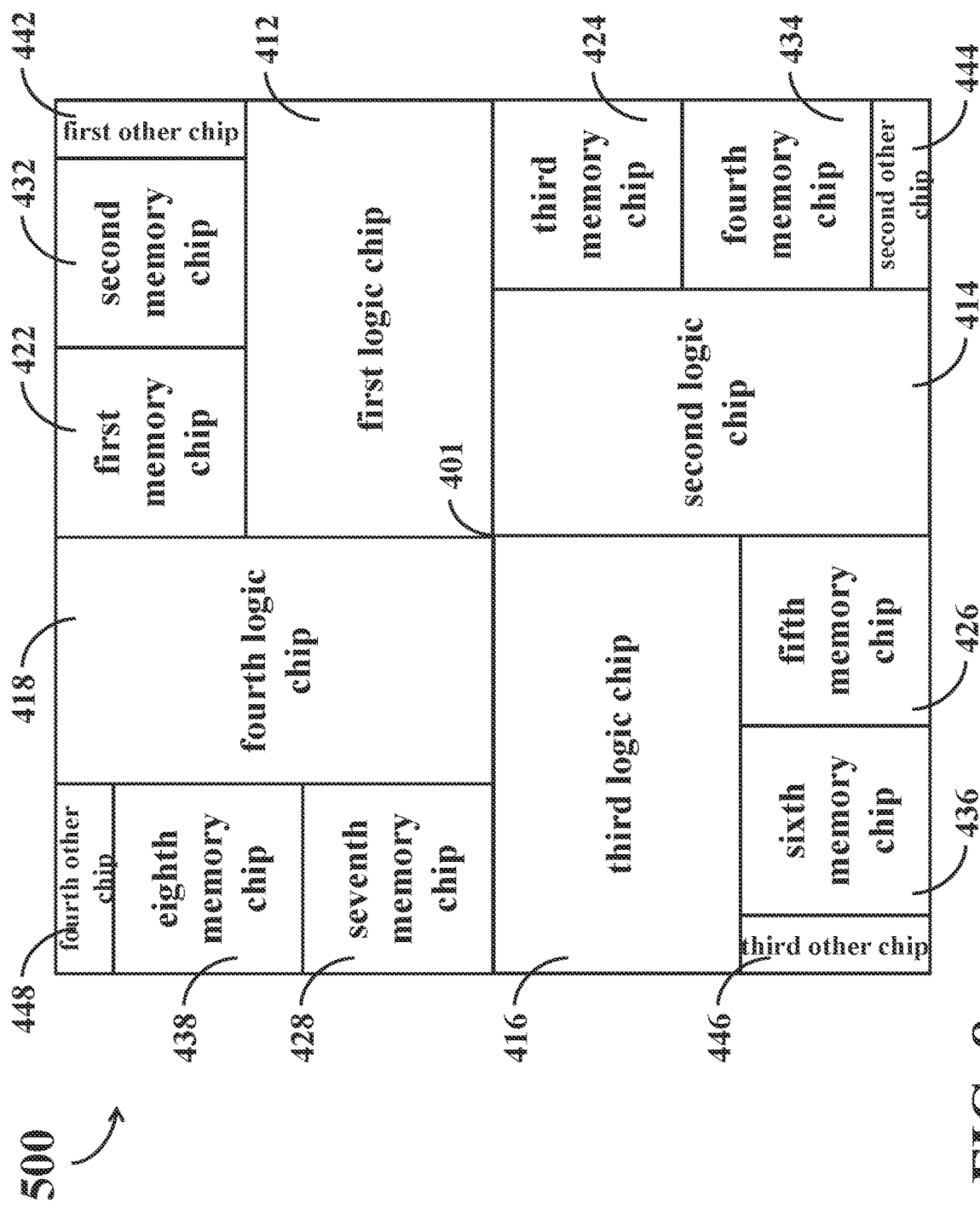
FIG. 8 illustrates a schematic diagram of a simplified chip floorplan arrangement of an IC product according to another embodiment of the present invention.

FIG. 8 is a schematic diagram of a simplified chip floorplan arrangement of an IC product according to another embodiment of the present invention. FIG. 8 shows a top view of the IC product 500. The IC product 500 is similar to the IC product 400, except that the first other chip 442, the second other chip 444, the third other chip 446, and the fourth other chip 448 are arranged at the four corners of the IC product 500, and the second memory chip 432 (the fourth memory chip 434, the sixth memory chip 436, or the eighth memory chip 438) is arranged between the first memory chip 422 (the third memory chip 424, the fifth memory chip 426, or the seventh memory chip 428) and the first other chip 442 (the second other chip 444, the third other chip 446, or the fourth other chip 448).

Figure 9:
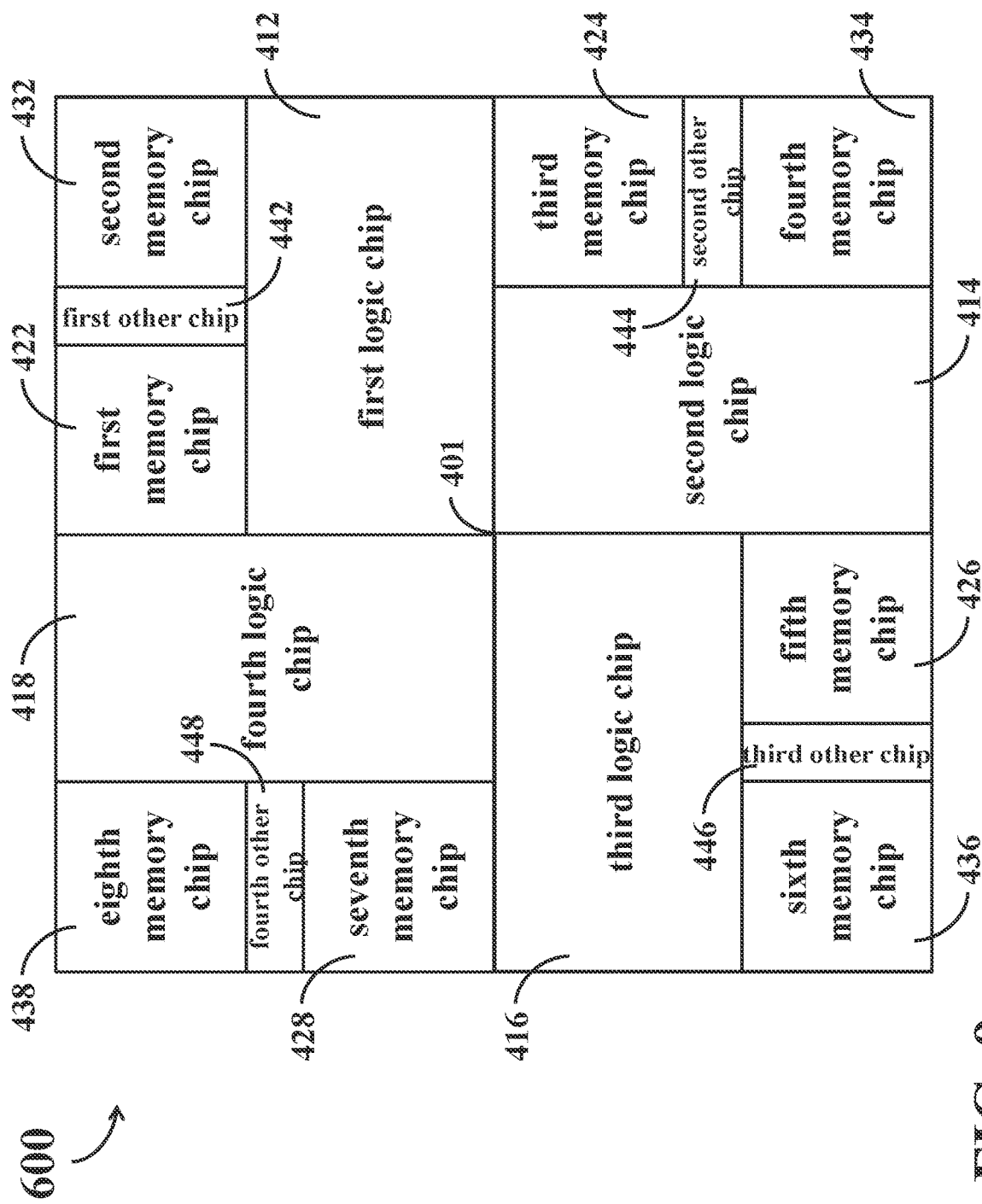
FIG. 9 illustrates a schematic diagram of a simplified chip floorplan arrangement of an IC product according to another embodiment of the present invention.
Figure 10:
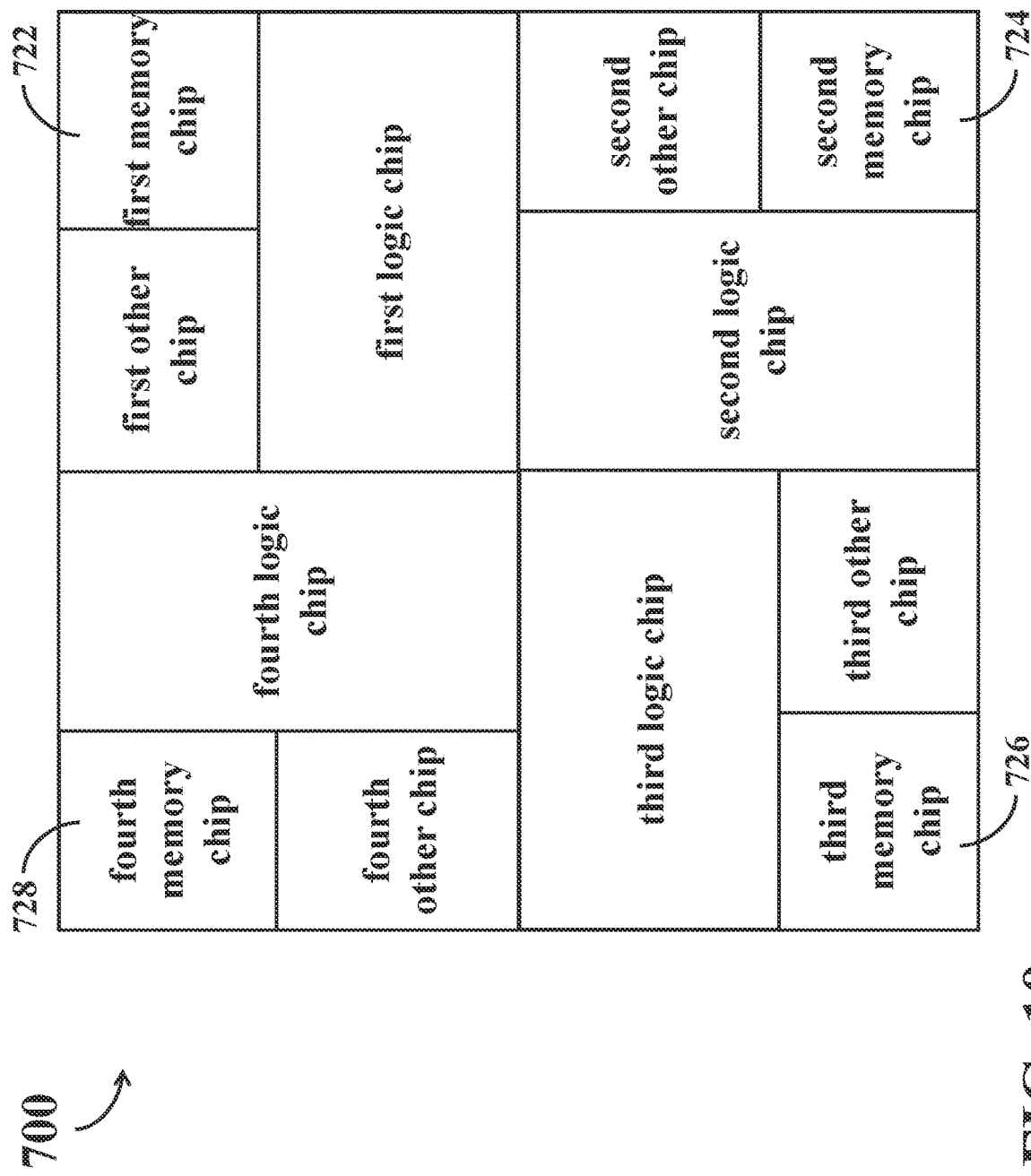
FIG. 10 illustrates a schematic diagram of a simplified chip floorplan arrangement of an IC product according to another embodiment of the present invention.
Figure 11:
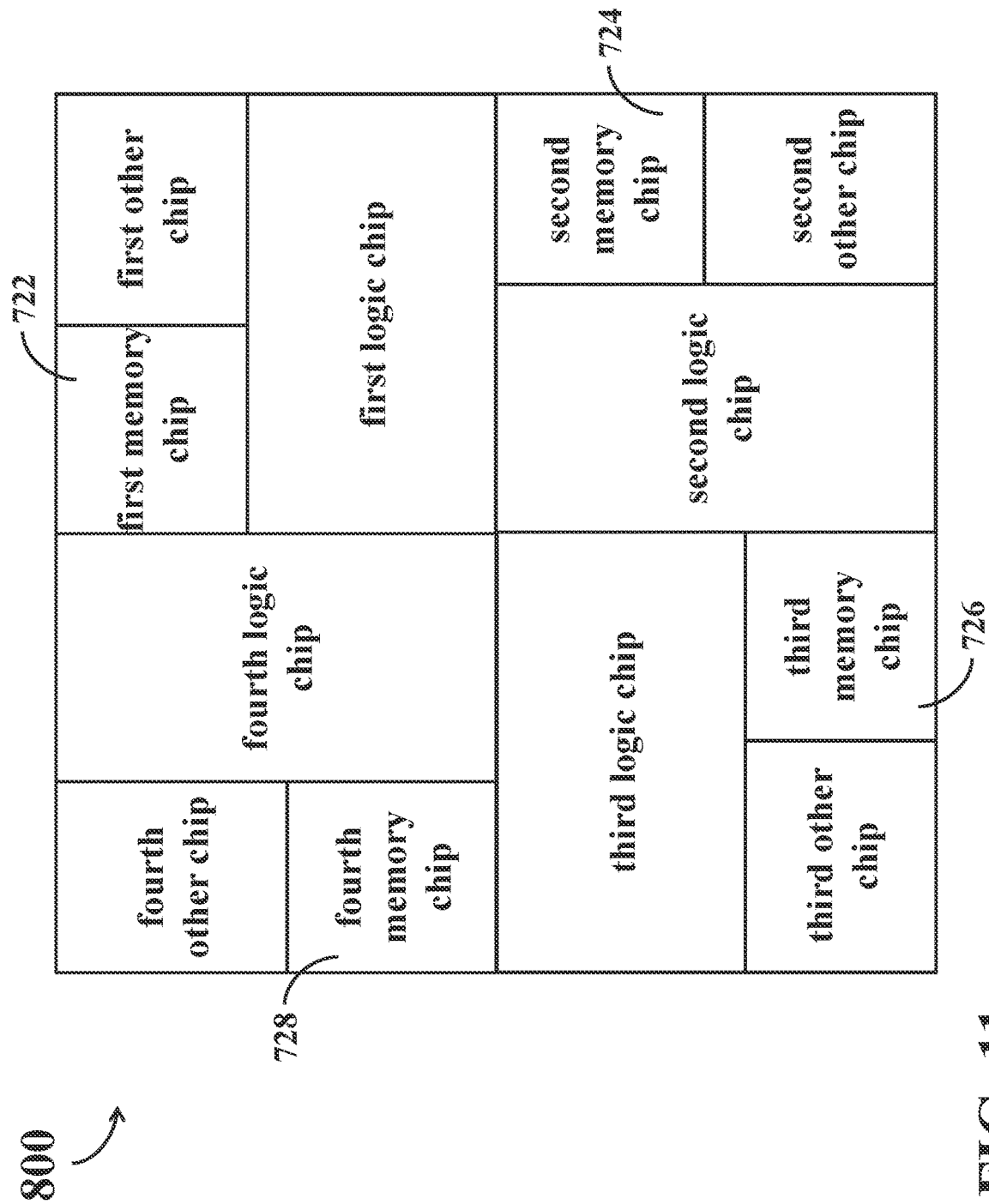
FIG. 11 illustrates a schematic diagram of a simplified chip floorplan arrangement of an IC product according to another embodiment of the present invention.
Figure 12:
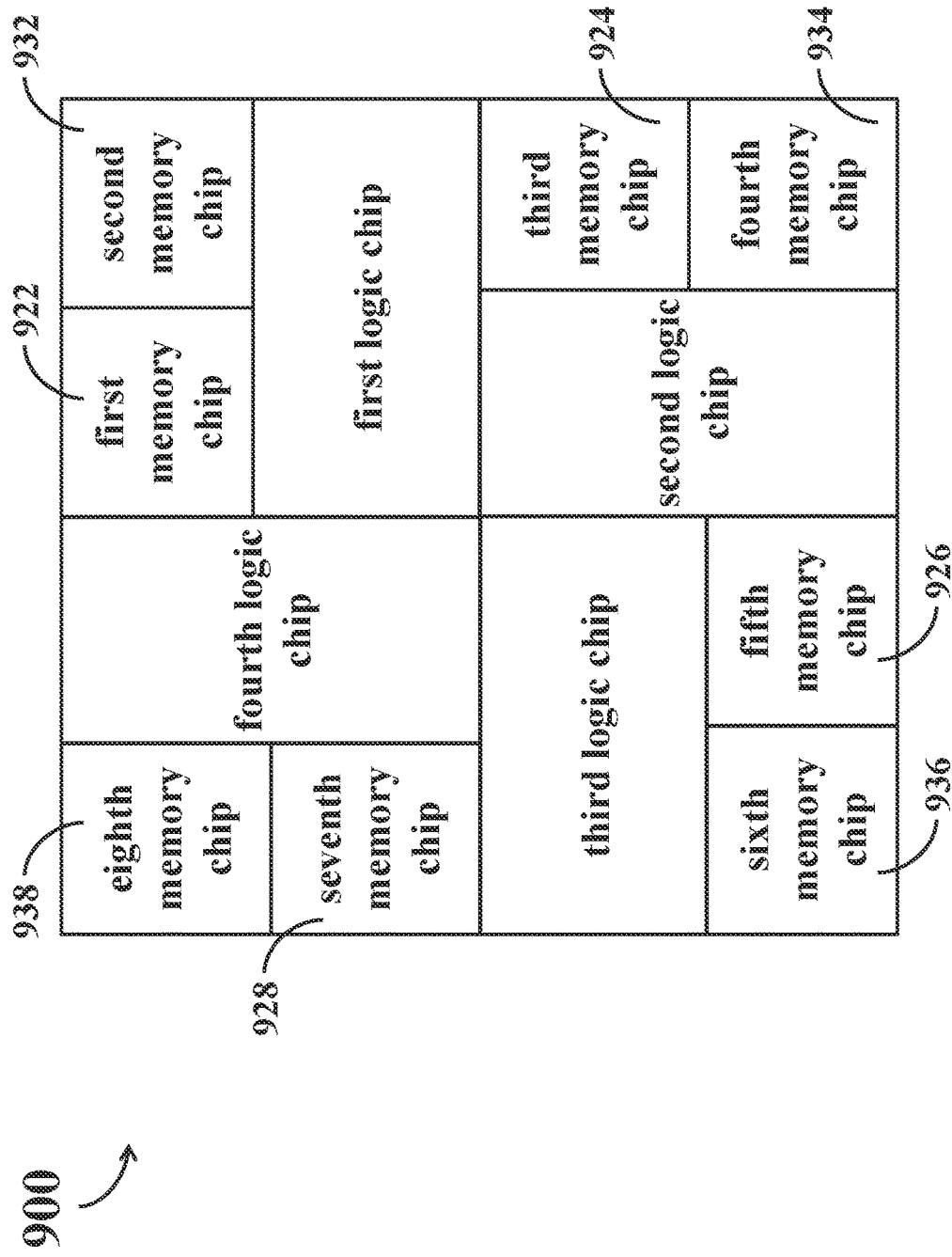
FIG. 12 illustrates a schematic diagram of a simplified chip floorplan arrangement of an IC product according to another embodiment of the present invention.
Figure 13:
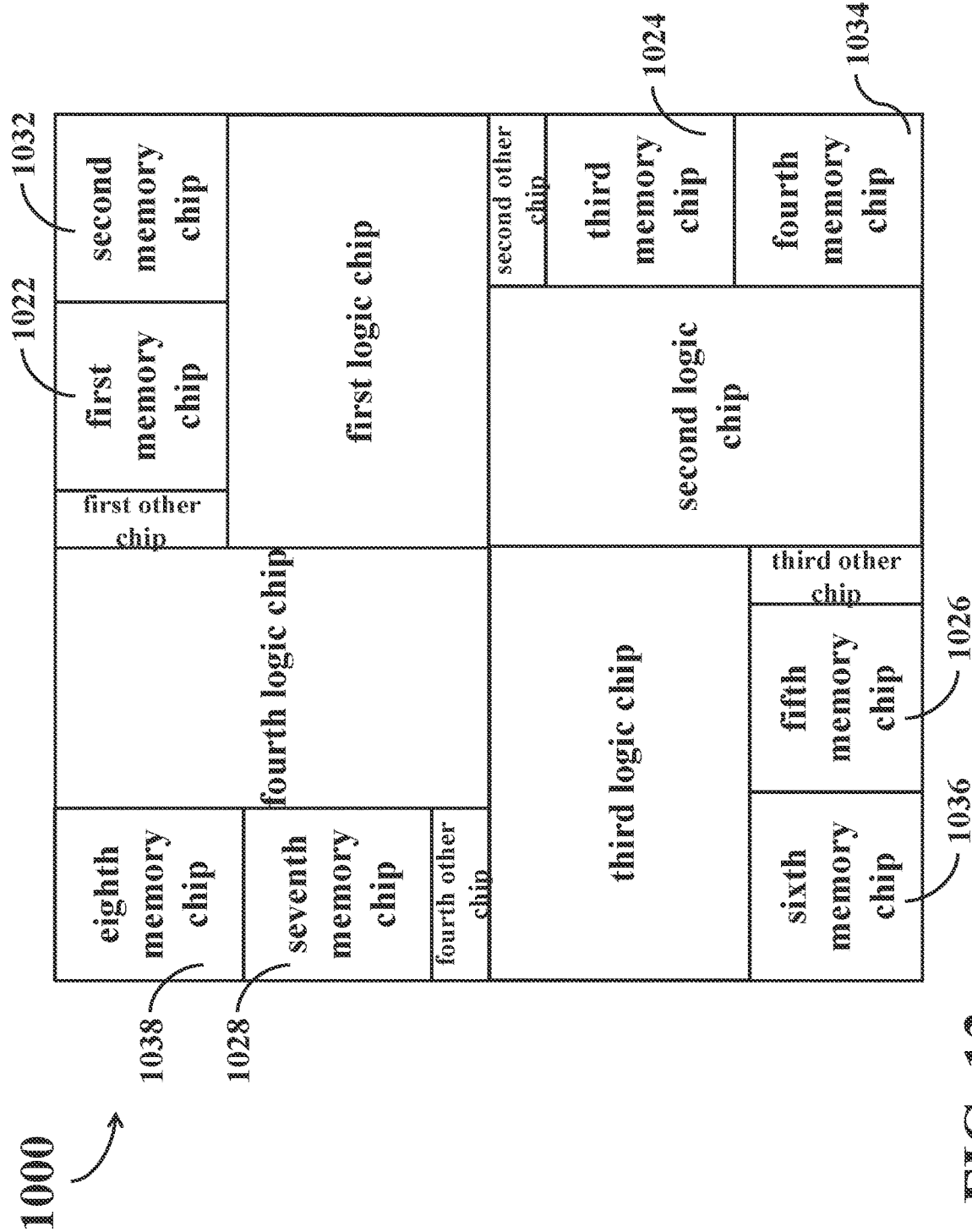
FIG. 13 illustrates a schematic diagram of a simplified chip floorplan arrangement of an IC product according to another embodiment of the present invention.
Figure 14:
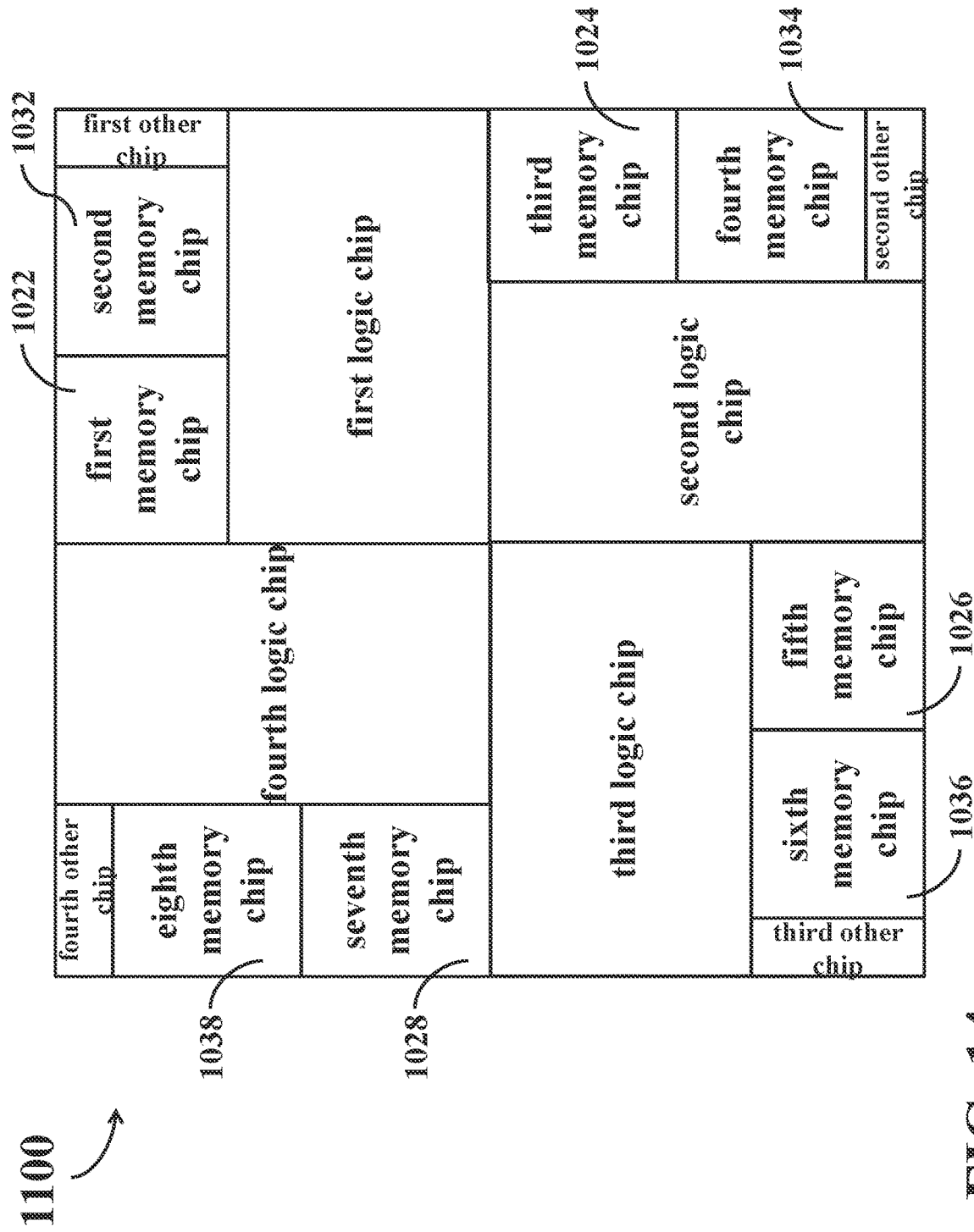
FIG. 14 illustrates a schematic diagram of a simplified chip floorplan arrangement of an IC product according to another embodiment of the present invention.
Figure 15:
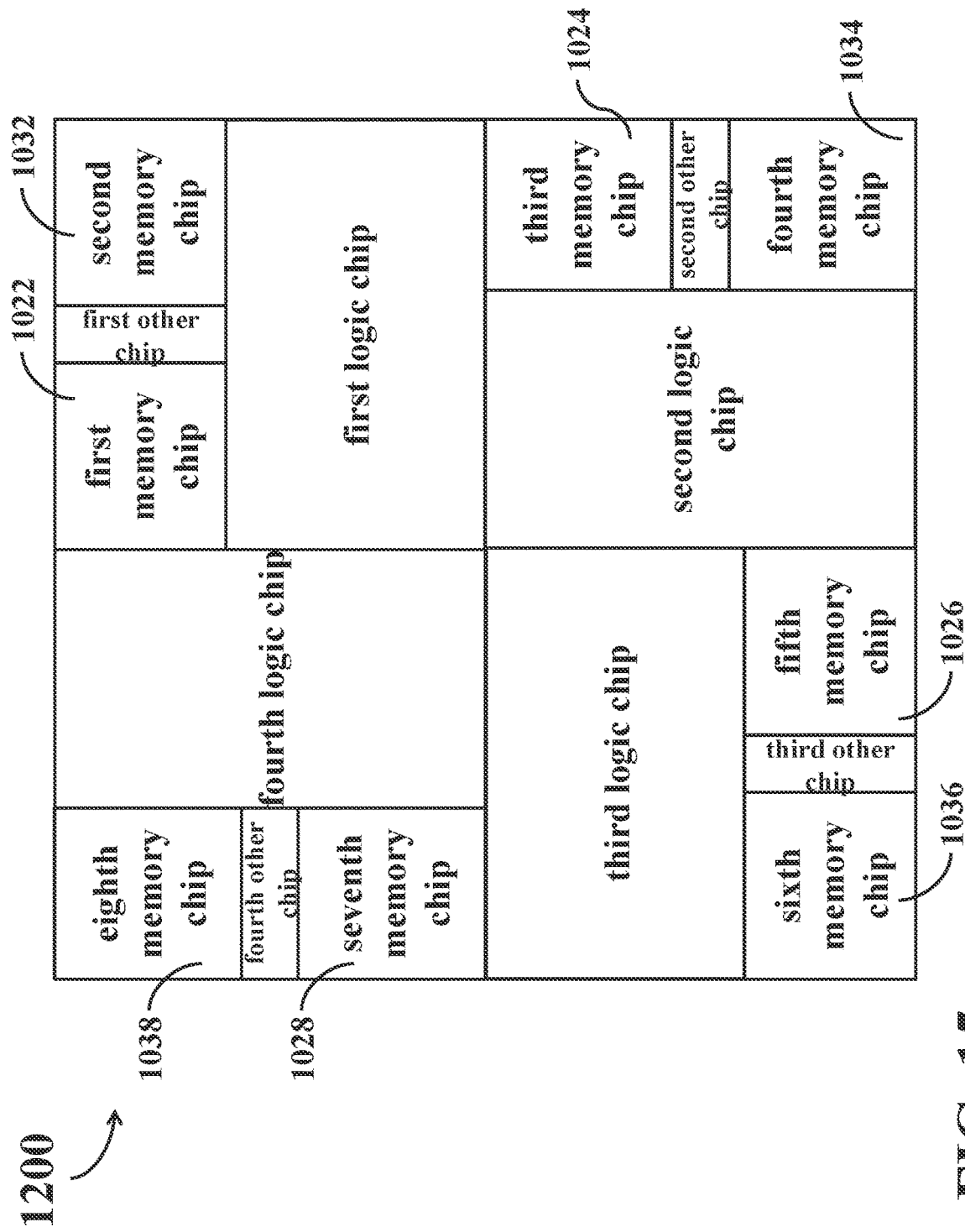
FIG. 15 illustrates a schematic diagram of a simplified chip floorplan arrangement of an IC product according to another embodiment of the present invention.

FIG. 9 is a schematic diagram of a simplified chip floorplan arrangement of an IC product according to another embodiment of the present invention. FIG. 9 shows a top view of the IC product 600. The IC product 600 is similar to the IC product 400, except that the first other chip 442 (the second other chip 444, the third other chip 446, or the fourth other chip 448) is arranged between the first memory chip 422 (the third memory chip 424, the fifth memory chip 426, or the seventh memory chip 428) and the second memory chip 432 (the fourth memory chip 434, the sixth memory chip 436, or the eighth memory chip 438).

The memory chips in FIG. 1 and FIGS. 5 to 9 are the high bandwidth memory generation 3 (HBM3) which is square in shape. However, the above-mentioned memory chips can also be the high bandwidth memory generation 2 (HBM2), as shown in FIGS. 10 to 15 (corresponding to FIGS. 1 and 5 to 9, respectively). The first memory chip 722, the second memory chip 724, the third memory chip 726, and the fourth memory chip 728 of the IC product 700 and the IC product 800, the first memory chip 922, the second memory chip 932, the third memory chip 924, the fourth memory chip 934, the fifth memory chip 926, the sixth memory chip 936, the seventh memory chip 928, and the eighth memory chip 938 of the IC product 900, the first memory chip 1022, the second memory chip 1032, the third memory chip 1024, the fourth memory chip 1034, the fifth memory chip 1026, the sixth memory chip 1036, the seventh memory chip 1028, and the eighth memory chip 1038 of the IC product 1000, the IC product 1100, and the IC product 1200 are the HBM2. The descriptions of FIGS. 10 to 15 may correspond to the descriptions of FIGS. 1 and 5 to 9 respectively, and the details are thus omitted for brevity.

In addition, in other embodiments, the memory chips in FIGS. 10 to 15 may be the Enhanced high bandwidth memory generation 2 (Enhanced HBM2).

In summary, according to the present invention, the proposed chip floorplan arrangement makes the most of the substrate area by tightly arranging the chips in the IC products, making the IC products more competitive. Furthermore, the rotationally symmetric floorplan arrangement and/or point-symmetric floorplan arrangement of the chips in the IC product can not only avoid waste of pins but also simplify the photomask in complexity because different parts of the IC product can be fabricated using of the same photomask.

In another aspect, the aforementioned rotationally symmetric and/or point-symmetric floorplan arrangement(s) of the chips on the IC product facilitate(s) the semiconductor manufacturers to fabricate, by using the same set of photomasks, the IC products that are nearly four times the area of the photomask, which significantly reduces the manufacturing cost of the IC products.

It should be noted that the floorplan arrangements of the chips in the IC product mentioned above are intended to illustrate the invention by way of examples, rather than to limit the actual implementation of the present invention. For example, in an alternative embodiment, the aforementioned logic chips, memory chips, and/or other chips can be arranged in the four quadrants of the IC product in line symmetry with respect to the central axis of the IC product which passes through the center and is perpendicular to any side.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to encompass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

In the drawings, the size and relative sizes of some elements may be exaggerated or simplified for clarity. Accordingly, unless the context clearly specifies, the shape, size, relative size, and relative position of each element in the drawings are illustrated merely for clarity, and not intended to be used to restrict the claim scope.

For the purpose of explanatory convenience in the specification, spatially relative terms, such as "on," "above," "below," "beneath," "higher," "lower," "upward," "downward," "forward," "backward," and the like, may be used herein to describe the function of a particular element or to describe the relationship of one element to another element(s) as illustrated in the drawings. It will be understood that the spatially relative terms are intended to encompass different orientations of the element in use, in operations, or in assembly in addition to the orientation depicted in the drawings. For example, if the element in the drawings is turned over, elements described as "on" or "above" other elements would then be oriented "under" or "beneath" the other elements. Thus, the exemplary term "beneath" can encompass both an orientation of above and beneath. For another example, if the element in the drawings is reversed, the action described as "forward" may become "backward," and the action described as "backward" may become "forward." Thus, the exemplary description "forward" can encompass both an orientation of forward and backward.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

Other embodiments of the invention will be apparent to those skilled in the art from consideration of the specification and practice of the invention disclosed herein. It is intended that the specification and examples be considered as exemplary only, with a true scope and spirit of the invention indicated by the following claims.

What is claimed is:

1. An integrated circuit (IC) product (100; 200; 300; 400; 500; 600), comprising:
    a first chip (112; 312; 412);
    a second chip (114; 314; 414);
    a third chip (116; 316; 416);
    a fourth chip (118; 318; 418);
    a fifth chip (122; 322; 422);
    a sixth chip (124; 324; 424);
    a seventh chip (126; 326; 426);
    an eighth chip (128; 328; 428);
    a ninth chip (132; 332; 432);
    a tenth chip (134; 334; 434);
    an eleventh chip (136; 336; 436); and
    a twelfth chip (138; 338; 438);
    wherein the first chip (112; 312; 412), the second chip (114; 314; 414), the third chip (116; 316; 416, and the fourth chip (118; 318; 418) are respectively arranged in a first quadrant, a fourth quadrant, a third quadrant, and a second quadrant of the IC product, and the first chip (112; 312; 412) is adjacent to the second chip (114; 314; 414) and the fourth chip (118; 318; 418);
    wherein the fifth chip (122; 322; 422), the sixth chip (124; 324; 424), the seventh chip (126; 326; 426), and the eighth chip (128; 328; 428) are respectively arranged in the first quadrant, the fourth quadrant, the third quadrant, and the second quadrant of the IC product, and any two of the fifth chip (122; 322; 422), the sixth chip (124; 324; 424), the seventh chip (126; 326; 426), and the eighth chip (128; 328; 428) are not adjacent to each other;
    wherein the ninth chip (132; 332; 432), the tenth chip (134; 334; 434), the eleventh chip (136; 336; 436), and the twelfth chip (138; 338; 438) are respectively arranged in the first quadrant, the fourth quadrant, the third quadrant, and the second quadrant of the IC product, and any two of the ninth chip (132; 332; 432), the tenth chip (134; 334; 434), the eleventh chip (136; 336; 436), and the twelfth chip (138; 338; 438) are not adjacent to each other;
    wherein the first chip (112; 312; 412), the second chip (114; 314; 414), the third chip (116; 316; 416), and the fourth chip (118; 318; 418) are adjacent to a second side (104), a third side (106), a fourth side (108), and a first side (102) of the IC product (100; 200; 300; 400; 500; 600), respectively.

2. The IC product (100; 200; 300; 400; 500; 600) of claim 1, wherein the first chip (112; 312; 412), the second chip (114 314; 414), the third chip (116; 316; 416), and the fourth chip (118; 318; 418) are logic chips that are substantially the same in area and constituent components; and the fifth chip (122; 322; 422), the sixth chip (124; 324; 424), the seventh chip (126; 326; 426), and the eighth chip (128; 328; 428) are memory chips that are substantially the same in area and constituent components.

3. The IC product (100; 200; 300; 400; 500; 600) of claim 2, wherein the first chip (112; 312; 412), the second chip (114; 314; 414), the third chip (116; 316; 416), the fourth chip (118; 318; 418), the fifth chip (122; 322; 422), the sixth chip (124; 324; 424), the seventh chip (126; 326; 426), the eighth chip (128; 328; 428), the ninth chip (132; 332; 432), the tenth chip (134; 334; 434), the eleventh chip (136; 336; 436), and the twelfth chip (138; 338; 438) are substantially on the same plane; and wherein the first chip (112; 312; 412) and the third chip (116; 316; 416) together possess point symmetry with respect to a center (101; 301; 401) of the IC product (100; 200; 300; 400; 500; 600), the second chip (114; 314; 414) and the fourth chip (118; 318; 418) together possess point symmetry with respect to the center (101; 301; 401), the fifth chip (122; 322; 422) and the seventh chip (126; 326; 426) together possess point symmetry with respect to the center (101; 301; 401), the sixth chip (124; 324; 424) and the eighth chip (128; 328; 428) together possess point symmetry with respect to the center (101; 301; 401), the ninth chip (132; 332; 432) and the eleventh chip (136; 336; 436) together possess point symmetry with respect to the center (101; 301; 401), and the tenth chip (134; 334; 434) and the twelfth chip (138; 338; 438) together possess point symmetry with respect to the center (101; 301; 401).

4. The IC product (100; 200; 300; 400; 500; 600) of claim 1, wherein the fifth chip (122; 322; 422), the sixth chip (124; 324; 424), the seventh chip (126; 326; 426), and the eighth chip (128; 328; 428) are adjacent to the first side (102), the second side (104), the third side (106), and the fourth side (108) of the IC product (100; 200; 300; 400; 500; 600), respectively.

5. The IC product (100) of claim 4, wherein the fifth chip (122), the sixth chip (124), the seventh chip (126), and the eighth chip (128) are further adjacent to the second side (104), the third side (106), the fourth side (108), and the first side (102) of the IC product (100), respectively.

6. The IC product (100; 200; 300; 400; 500; 600) of claim 1, wherein the ninth chip (132; 332; 432), the tenth chip (134; 334; 434), the eleventh chip (136; 336; 436), and the twelfth chip (138; 338; 438) are adjacent to the first side (102), the second side (104), the third side (106), and the fourth side (108) of the IC product (100; 200; 300; 400; 500; 600), respectively.

7. The IC product (200; 300; 400; 600) of claim 6, wherein the ninth chip (132; 332; 432), the tenth chip (134; 334; 434), the eleventh chip (136; 336; 436), and the twelfth chip (138; 338; 438) are further adjacent to the second side (104), the third side (106), the fourth side (108), and the first side (102) of the IC product (200; 300; 400; 600), respectively.

8. The IC product (300; 400; 500; 600) of claim 2, wherein the ninth chip (332; 432), the tenth chip (334; 434), the eleventh chip (336; 436), and the twelfth chip (338; 438) are memory chips.

9. The IC product (400; 500; 600) of claim 8, further comprising:
a thirteenth chip (442);
a fourteenth chip (444);
a fifteenth chip (446); and
a sixteenth chip (448);
wherein the thirteenth chip (442), the fourteenth chip (444), the fifteenth chip (446), and the sixteenth chip (448) are arranged in the first quadrant, the fourth quadrant, the third quadrant, and the second quadrant, respectively; and the fifth chip (422), the sixth chip (424), the seventh chip (426), the eighth chip (428), the ninth chip (432), the tenth chip (434), the eleventh chip (436), the twelfth chip (438), the thirteenth chip (442), the fourteenth chip (444), the fifteenth chip (446), and the sixteenth chip (448) are the same in width (W1).

10. The IC product (400; 500) of claim 9, wherein the fifth chip (422) is arranged between the ninth chip (432) and the thirteenth chip (442), the sixth chip (424) is arranged between the tenth chip (434) and the fourteenth chip (444), the seventh chip (426) is arranged between the eleventh chip (436) and the fifteenth chip (446), and the eighth chip (428) is arranged between the twelfth chip (438) and the sixteenth chip (448).

11. The IC product (400) of claim 10, wherein the ninth chip (432), the tenth chip (434), the eleventh chip (436), and the twelfth chip (438) are arranged at four corners of the IC product (400), respectively.

12. The IC product (500) of claim 10, wherein the thirteenth chip (442), the fourteenth chip (444), the fifteenth chip (446), and the sixteenth chip (448) are arranged at four corners of the IC product (500), respectively.

13. The IC product (600) of claim 9, wherein the thirteenth chip (442) is arranged between the fifth chip (422) and the ninth chip (432), the fourteenth chip (444) is arranged between the sixth chip (424) and the tenth chip (434), the fifteenth chip (446) is arranged between the seventh chip (426) and the eleventh chip (436), and the sixteenth chip (448) is arranged between the eighth chip (428) and the twelfth chip (438).

14. An integrated circuit (IC) product (100; 200; 300; 400; 500; 600), comprising:
a first chip (112; 312; 412);
a second chip (114; 314; 414);
a third chip (116; 316; 416);
a fourth chip (118; 318; 418);
a fifth chip (122; 322; 422);
a sixth chip (124; 324; 424);
a seventh chip (126; 326; 426);
an eighth chip (128; 328; 428);
a ninth chip (132; 332; 432);
a tenth chip (134; 334; 434);
an eleventh chip (136; 336; 436); and
a twelfth chip (138; 338; 438);
wherein the first chip (112; 312; 412), the second chip (114; 314; 414), the third chip (116; 316; 416), the fourth chip (118; 318; 418), the fifth chip (122; 322; 422), the sixth chip (124; 324; 424), the seventh chip (126; 326; 426), the eighth chip (128; 328; 428), the ninth chip (132; 332; 432), the tenth chip (134; 334; 434), the eleventh chip (136; 336; 436), and the twelfth chip (138; 338; 438) are substantially on a plane (PL);
wherein when the first chip (112; 312; 412) is rotated 90 degrees on the plane with respect to a center (101; 301; 401) of the IC product (100; 200; 300; 400; 500; 600), the first chip (112; 312; 412) substantially overlaps with the second chip (114; 314; 414) or the fourth chip (118; 318; 418), and when the first chip (112; 312; 412) is rotated 180 degrees on the plane with respect to the center (101; 301; 401), the first chip (112; 312; 412) substantially overlaps with the third chip (116; 316; 416);
wherein when the fifth chip (122; 322; 422) is rotated 90 degrees on the plane with respect to the center (101; 301; 401), the fifth chip (122; 322; 422) substantially overlaps with the sixth chip (124; 324; 424) or the eighth chip (128; 328; 428), and when the fifth chip (122; 322; 422) is rotated 180 degrees on the plane with respect to the center (101; 301; 401), the fifth chip (122; 322; 422) substantially overlaps with the seventh chip (126; 326; 426);
wherein when the ninth chip (132; 332; 432) is rotated 90 degrees on the plane with respect to the center (101; 301; 401), the ninth chip (132; 332; 432) substantially overlaps with the tenth chip (134; 334; 434) or the twelfth chip (138; 338; 438), and when the ninth chip (132; 332; 432) is rotated 180 degrees on the plane with respect to the center (101; 301; 401), the ninth chip (132; 332; 432) substantially overlaps with the eleventh chip (136; 336; 436);
wherein the first chip (112; 312; 412), the second chip (114; 314; 414), the third chip (116; 316; 416), and the fourth chip (118; 318; 418) are adjacent to a second side (104), a third side (106), a fourth side (108), and a first side (102) of the IC product (100; 200; 300; 400; 500; 600), respectively.

15. The IC product (100; 200; 300; 400; 500; 600) of claim 14, wherein the first chip (112; 312; 412), the second chip (114 314; 414), the third chip (116; 316; 416), and the fourth chip (118; 318; 418) are logic chips that are substantially the same in area and constituent components; and the fifth chip (122; 322; 422), the sixth chip (124; 324; 424), the seventh chip (126; 326; 426), and the eighth chip (128; 328; 428) are memory chips that are substantially the same in area and constituent components.

16. The IC product (100; 200; 300; 400; 500; 600) of claim 15, wherein the first chip (112; 312; 412) is adjacent to the second chip (114; 314; 414) and the fourth chip (118; 318; 418), and the second chip (114; 314; 414) is adjacent to the first chip (112; 312; 412) and the third chip (116; 316; 416).

17. The IC product (100; 200; 300; 400; 500; 600) of claim 15, wherein any two of the fifth chip (122; 322; 422), the sixth chip (124; 324; 424), the seventh chip (126; 326; 426), and the eighth chip (128; 328; 428) are not adjacent to each other, and any two of the ninth chip (132; 332; 432), the tenth chip (134; 334; 434), the eleventh chip (136; 336; 436), and the twelfth chip (138; 338; 438) are not adjacent to each other.

18. The IC product (100; 200; 300; 400; 500; 600) of claim 14, wherein the fifth chip (122; 322; 422), the sixth chip (124; 324; 424), the seventh chip (126; 326; 426), and the eighth chip (128; 328; 428) are adjacent to the first side (102), the second side (104), the third side (106), and the fourth side (108) of the IC product (100; 200; 300; 400; 500; 600), respectively.

19. The IC product (100) of claim 18, wherein the fifth chip (122), the sixth chip (124), the seventh chip (126), and the eighth chip (128) are further adjacent to the second side (104), the third side (106), the fourth side (108), and the first side (102) of the IC product (100), respectively.

20. The IC product (100; 200; 300; 400; 500; 600) of claim 14, wherein the ninth chip (132; 332; 432), the tenth chip (134; 334; 434), the eleventh chip (136; 336; 436), and the twelfth chip (138; 338; 438) are adjacent to the first side (102), the second side (104), the third side (106), and the fourth side (108) of the IC product (100; 200; 300; 400; 500; 600), respectively.

21. The IC product (200; 300; 400; 600) of claim 20, wherein the ninth chip (132; 332; 432), the tenth chip (134; 334; 434), the eleventh chip (136; 336; 436), and the twelfth chip (138; 338; 438) are further adjacent to the second side (104), the third side (106), the fourth side (108), and the first side (102) of the IC product (200; 300; 400; 600), respectively.

22. The IC product (300; 400; 500; 600) of claim 15, wherein the ninth chip (332; 432), the tenth chip (334; 434), the eleventh chip (336; 436), and the twelfth chip (338; 438) are memory chips.

23. The IC product (400; 500; 600) of claim 22, further comprising:
   a thirteenth chip (442);
   a fourteenth chip (444);
   a fifteenth chip (446); and
   a sixteenth chip (448);
   wherein the thirteenth chip (442), the fourteenth chip (444), the fifteenth chip (446), and the sixteenth chip (448) are substantially on the plane (PL); and the fifth chip (422), the sixth chip (424), the seventh chip (426), the eighth chip (428), the ninth chip (432), the tenth chip (434), the eleventh chip (436), the twelfth chip (438), the thirteenth chip (442), the fourteenth chip (444), the fifteenth chip (446), and the sixteenth chip (448) are the same in width (W1).

24. The IC product (400; 500) of claim 23, wherein the fifth chip (422) is arranged between the ninth chip (432) and the thirteenth chip (442), the sixth chip (424) is arranged between the tenth chip (434) and the fourteenth chip (444), the seventh chip (426) is arranged between the eleventh chip (436) and the fifteenth chip (446), and the eighth chip (428) is arranged between the twelfth chip (438) and the sixteenth chip (448).

25. The IC product (400) of claim 24, wherein the ninth chip (432), the tenth chip (434), the eleventh chip (436), and the twelfth chip (438) are arranged at four corners of the IC product (400), respectively.

26. The IC product (500) of claim 24, wherein the thirteenth chip (442), the fourteenth chip (444), the fifteenth chip (446), and the sixteenth chip (448) are arranged at four corners of the IC product (500), respectively.

27. The IC product (600) of claim 23, wherein the thirteenth chip (442) is arranged between the fifth chip (422) and the ninth chip (432), the fourteenth chip (444) is arranged between the sixth chip (424) and the tenth chip (434), the fifteenth chip (446) is arranged between the seventh chip (426) and the eleventh chip (436), and the sixteenth chip (448) is arranged between the eighth chip (428) and the twelfth chip (438).

* * * * *